US010247145B2

(12) United States Patent
Cho (10) Patent No.: US 10,247,145 B2
(45) Date of Patent: Apr. 2, 2019

(54) VALVE SHAFT POSITION SENSING TYPE EGR VALVE

(71) Applicant: KORENS CO., LTD., Yangsan-si (KR)

(72) Inventor: Yong Kuk Cho, Busan (KR)

(73) Assignee: KORENS CO., LTD., Yangsan-si (KR)

(*) Notice: Subject to any disclaimer, the term of this patent is extended or adjusted under 35 U.S.C. 154(b) by 0 days.

(21) Appl. No.: 15/758,060

(22) PCT Filed: Mar. 15, 2016

(86) PCT No.: PCT/KR2016/002578
§ 371 (c)(1),
(2) Date: Mar. 7, 2018

(87) PCT Pub. No.: WO2017/043719
PCT Pub. Date: Mar. 16, 2017

(65) Prior Publication Data
US 2018/0179996 A1 Jun. 28, 2018

(30) Foreign Application Priority Data
Sep. 11, 2015 (KR) .................. 10-2015-0129113

(51) Int. Cl.
*F02M 26/48* (2016.01)
*F16H 19/00* (2006.01)
(Continued)

(52) U.S. Cl.
CPC ............ *F02M 26/48* (2016.02); *F02M 26/54* (2016.02); *F16H 19/00* (2013.01); *F16H 19/001* (2013.01);
(Continued)

(58) Field of Classification Search
CPC ........ F02M 26/48; F02M 26/54; F16H 19/00; F16H 19/001; F16H 25/186; F16K 31/04;
(Continued)

(56) References Cited

U.S. PATENT DOCUMENTS 4,411,242 A * 10/1983 Igashira .................. F02D 21/08
123/568.28
2015/0330335 A1* 11/2015 Shimada ................. F02D 41/22
123/568.16

FOREIGN PATENT DOCUMENTS

JP 2014-040792 3/2014
KR 10-2003-0069406 8/2003
(Continued)

*Primary Examiner* — Hieu T Vo
(74) *Attorney, Agent, or Firm* — Lex IP Meister, PLLC (57) ABSTRACT

A EGT valve of the present invention includes: a valve shaft vertically disposed and moving up and down by rotating about a vertical rotational axis; a cylindrical cam integrally fitted around an upper portion of the valve shaft and having a spiral groove on an outer side and a polyhedron at an upper end; a fixed bearing fixed to a side of the cylindrical camp with an end slidably inserted in the spiral groove; a rotary gear having the polyhedron inserted on the rotational axis therein and rotated by a rotary motor; an elevating block disposed at an upper end of the valve shaft passing through the cylindrical cam and pushed upward by the valve shaft when the valve shaft is moved up; a pressing spring applying downward elasticity to the elevating block; a magnet plate fixed to a side of the elevating block; a hall sensor sensing up-down movement of the magnet plate; and a housing keeping the valve shaft, the cylindrical camp, the rotary gear, and the elevating block therein.

7 Claims, 7 Drawing Sheets (51) Int. Cl.
  *F16K 31/04* (2006.01)
  *G01D 5/14* (2006.01)
  *F02M 26/54* (2016.01)
  *F16H 25/18* (2006.01)
  *F16K 37/00* (2006.01)

(52) U.S. Cl.
  CPC ........... *F16H 25/186* (2013.01); *F16K 31/04* (2013.01); *F16K 31/047* (2013.01); *F16K 37/0041* (2013.01); *G01D 5/14* (2013.01); *G01D 5/145* (2013.01)

(58) Field of Classification Search
  CPC ..... F16K 31/047; F16K 37/0041; G01D 5/14; G01D 5/145
  See application file for complete search history.

(56) References Cited

FOREIGN PATENT DOCUMENTS

| | | |
|---|---|---|
| KR | 10-2013-0032967 | 4/2013 |
| KR | 10-1519901 | 5/2015 |
| KR | 10-2015-0101518 | 9/2015 |

\* cited by examiner

VALVE SHAFT POSITION SENSING TYPE EGR VALVE

TECHNICAL FIELD

The present invention relates to an EGR valve that can sense the height of a valve shaft using a magnet and a hall sensor and, more particularly, to an EGR valve that has a component equipped with a magnet that only moves up and down without rotating and more precisely senses the height of a valve shaft.

BACKGROUND ART

In general, nitrogen oxides (NOx) are produced when oxygen and nitrogen are combined at high pressure and high temperature, and in order to suppress the combination, an EGR (exhaust gas recirculation) system that reduces production of NOx by reducing the highest combustion temperature and reducing supply of oxygen by supplying some of exhaust gas discharged to the atmosphere back to an intake port is used.

When some of the exhaust gas discharged to the atmosphere is supplied back to the intake port, the combustion status of fuel depends on the amount of combustion gas supplied back to the intake port by the EGR system, which influences the power of an engine and NOx and PMs (particulate matter) contained in the exhaust gas. That is, the EGR system decreases the combustion temperature of the engine and reduces the production amount of NOx by returning some of the exhaust gas discharged from the engine to the intake system of cylinders.

As described above, in an EGR system, the amount of exhaust gas that is returned is an important factor and the part that controls the gas that is returned is an EGR valve. The EGR valve is disposed in a recirculation channel to be able to control recirculation of exhaust gas and can sense the height of a shaft coupled to the valve, that is, a valve shaft.

An EGR valve in the related art is described hereafter in detail with reference to the accompanying drawings.

Figure 1:
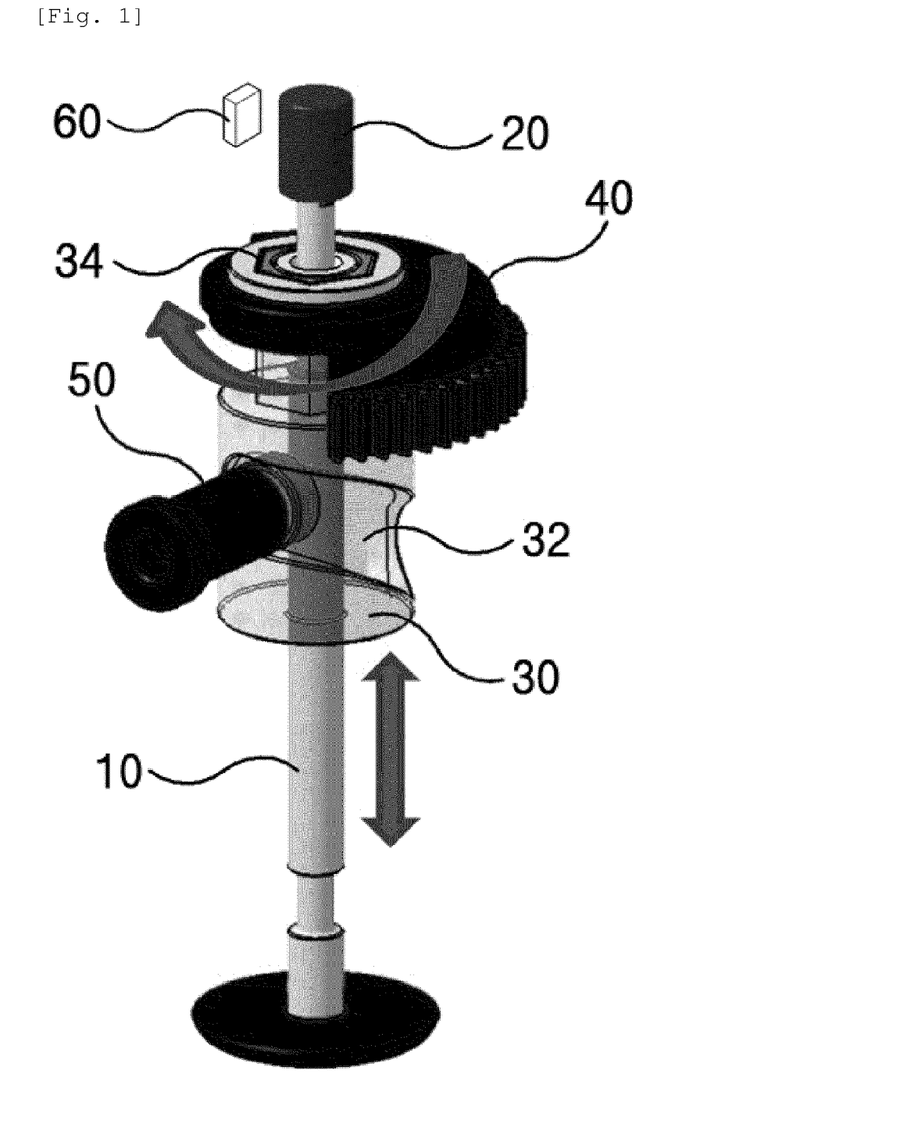
FIG. 1 is a perspective view showing the internal structure of an EGR valve of the related art.
Figure 2:
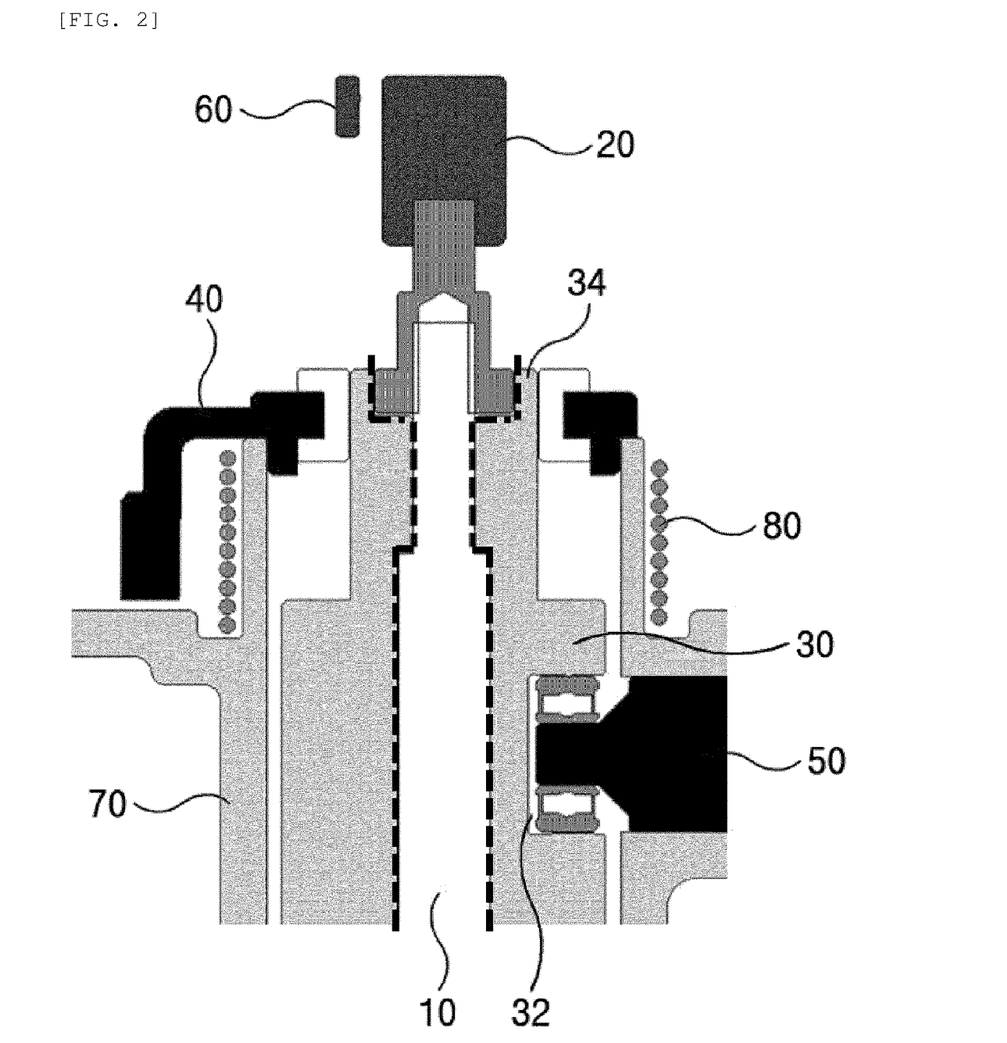
FIG. 2 is a partial cross-sectional view of the EGR valve of the related art.

FIG. 1 is a perspective view showing the internal structure of an EGR valve of the related art and FIG. 2 is a partial cross-sectional view of the EGR valve of the related art.

As shown in FIGS. 1 and 2, the EGR valve of the related art includes: a valve shaft 10 vertically disposed and moving up and down by rotating about its vertical central axis; a cylindrical cam 30 integrally fitted on a portion of the valve shaft 10 and having a spiral groove 32 on the outer side and a polyhedron 34 at the upper end; a fixed bearing 50 fixed to a side of the cylindrical cam 30 with one end slidably inserted in the spiral groove 32; a rotary gear 40 having the polyhedron 34 inserted on the rotational axis therein; a cylindrical magnet 20 coupled to the upper end of the valve shaft 10 passing through the cylindrical cam 30; a hall sensor 60 fixed to a side of the cylindrical magnet 20 and sensing up-down movement of the cylindrical magnet 20; and a return spring 80 returning the rotational angle of the rotary gear 40 to the initial state.

When the rotary gear is rotated by a separate rotary motor, the cylindrical cam 30 and the valve shaft 10 are rotated with the rotary gear 40, and in this process, the position of the spiral groove 32 in which the fixed bearing 50 is inserted is changed, so the cylindrical cam 30 and the valve shaft 10 move upward along the slope of the spiral groove 32 while rotating. As the valve shaft 10 moves up by rotating, the cylindrical magnet 20 also moves up by rotating and the hall sensor 60 senses the upward movement of the cylindrical magnet 20 and can calculate the upward movement distance of the valve shaft 10.

Meanwhile, as the valve shaft 10 rotates while moving up, the cylindrical magnet 20 at the end of the valve shaft 10 also rotates, in which when the magnet is not precisely magnetized, the magnetic flux may be changed by the rotation. When the magnet flux is changed, as described above, the hall sensor 60 may generate a sensing error, that is, it may sense the change as a vertical position change of the cylindrical magnet 20. Further, as the rotary gear 40 is rotated, the return spring 80 is rolled and the diameter decreases, so the side of a housing interferes with the return spring 80. Meanwhile, generally, the rotary gear 40 is made of synthetic resin and the housing 70 is made of an aluminum alloy, so when the rotary gear 40 and the housing 70 are brought in direct contact with each other, they may be damaged due to friction between different materials.

DISCLOSURE

Technical Problem

The present invention has been made in an effort to solve the problem and an object of the preset invention is to provide an EGR valve that can considerably reduce a sensing error when measuring up-down movement of a valve shaft and prevent interference and wear between parts when the valve shaft is moved up and down.

Technical Solution

In order to achieve the objects, a EGR valve of the present invention includes: a valve shaft vertically disposed and rotating about a vertical rotational axis; a cylindrical cam integrally fitted around an upper portion of the valve shaft and having a spiral groove on an outer side and a polyhedron at an upper end; a fixed bearing fixed to a side of the cylindrical camp with an end slidably inserted in the spiral groove; a rotary gear having the polyhedron inserted on the rotational axis therein and rotated by a rotary motor; an elevating block disposed at an upper end of the valve shaft passing through the cylindrical cam and pushed upward by the valve shaft when the valve shaft is moved up; a pressing spring applying downward elasticity to the elevating block; a magnet plate fixed to a side of the elevating block; a hall sensor sensing up-down movement of the magnet plate; and a housing keeping the valve shaft, the cylindrical camp, the rotary gear, and the elevating block therein.

The EGR valve may further include a magnet holder fixed to a side, which faces the hall sensor, of the elevating block and keeping the magnet plate vertically erected on the side facing the hall sensor, and guide wings having ends inserted in the housing to be able to slide up and down may be formed at both sides in a width direction of the magnet holder.

A side, which faces the hall sensor, of the magnet plate may be curved to be closer to the hall sensor at a center portion than upper and lower portions.

The EGR valve may further include a return spring formed in a coil spring shape fitted around a portion of the cylindrical cam with a top coupled to a bottom of the rotary gear to apply rotational elasticity to the rotary gear, and a ring-shaped seating groove in which the top of the return spring is fitted may be formed on a bottom of the rotary gear.

The rotary gear may be seated on an upwardly protruding cylindrical end of the housing and may have a ring-shaped gear washer made of stainless steel and disposed at a portion seated on the housing, and the housing may have a seating washer made of stainless steel and disposed under the gear washer.

A downward projection protruding downward to be in point contact with the seating washer may be formed at a position, which is seated on the seating washer, on a bottom of the gear washer.

Three or more downward projections may be formed and arranged radially from a rotational axis of the rotary gear.

Advantageous Effects

According to the EGR valve of the present invention, it is possible to more accurately measure up- down movement of a valve shaft even though the valve shaft moves up and down by rotating, it is also possible to interference on a return spring by a housing or wear of a rotary gear and the housing when the rotary gear is rotated, and it is also possible to achieve smoother operation by minimizing friction that is generated when the rotary gear is rotated.

MODE FOR INVENTION

An embodiment of an EGR valve according to the present invention is described hereafter in detail with reference to the accompanying drawings.

Figure 3:
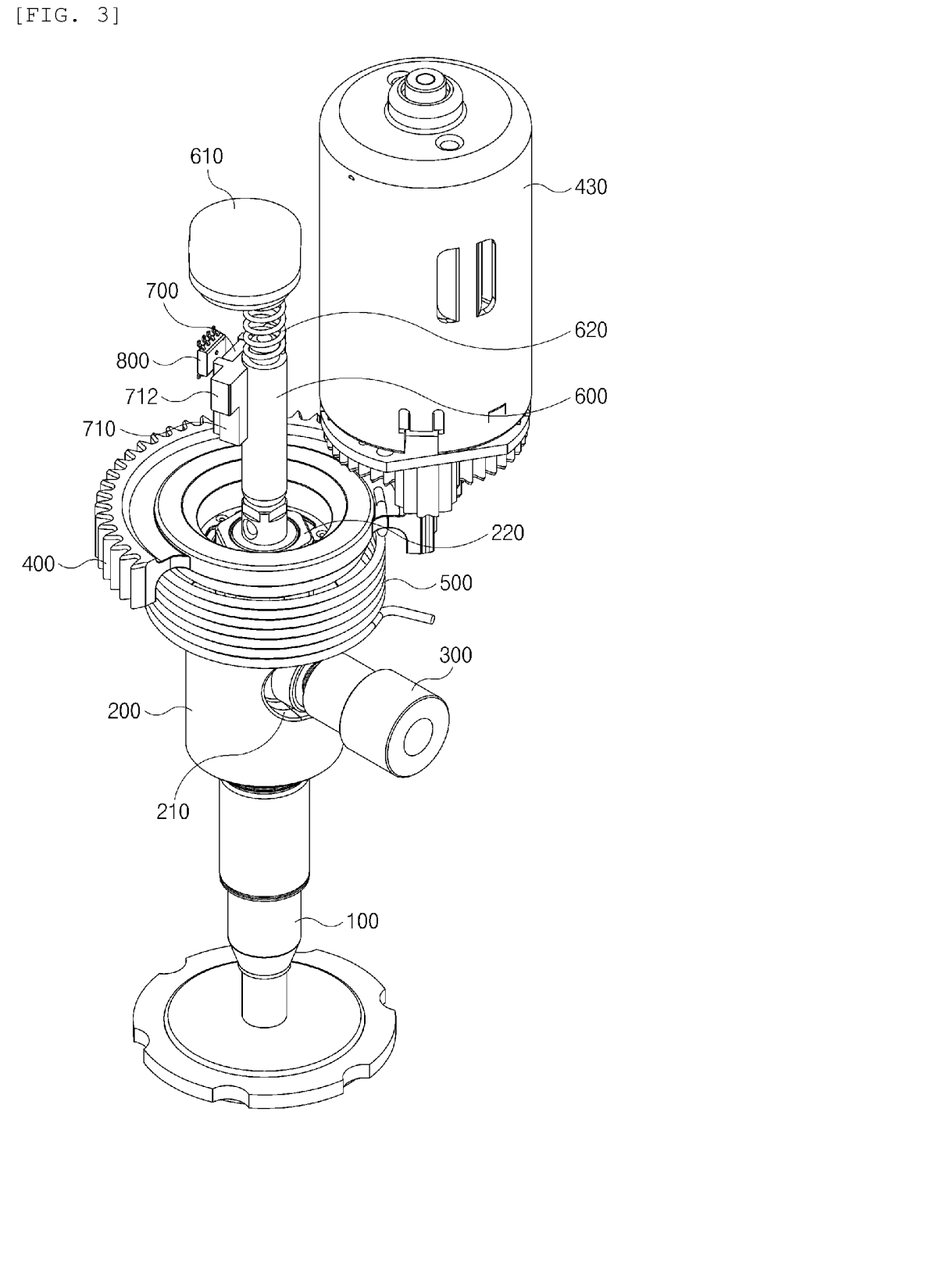
FIG. 3 is a perspective view showing the internal structure of an EGR valve according to the present invention.
Figure 4:
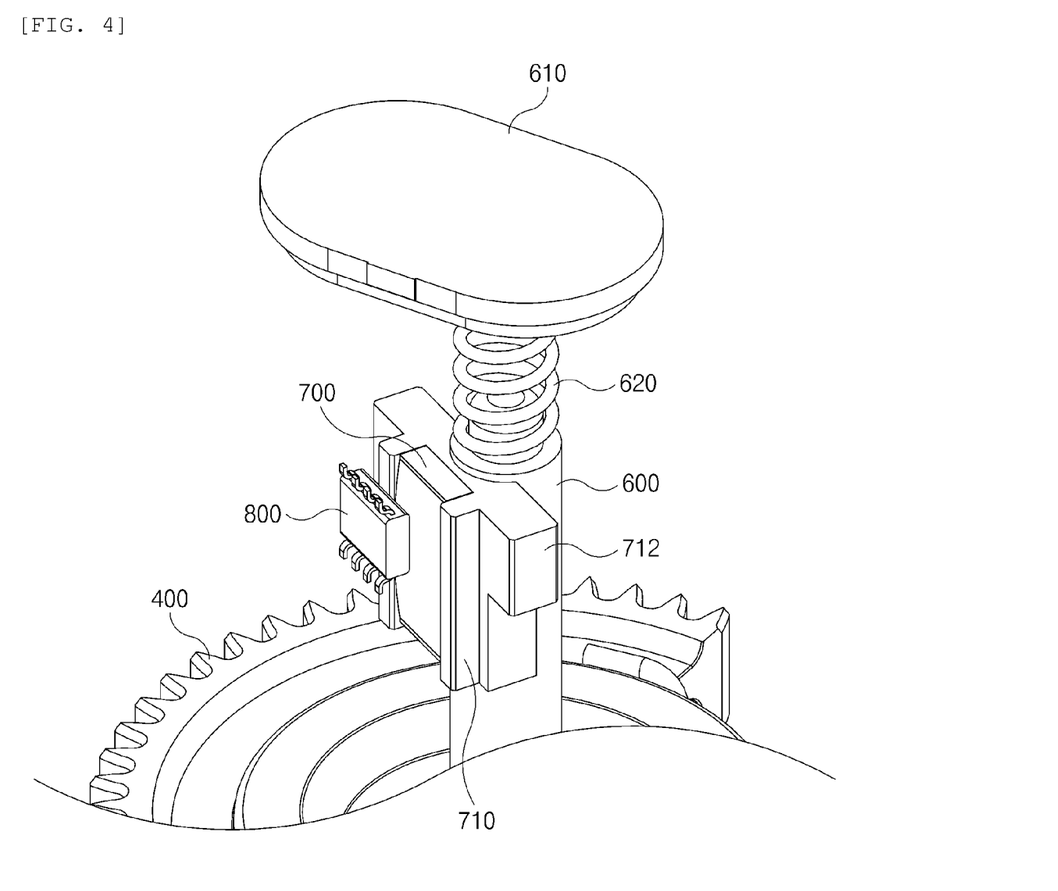
FIGS. 4 and 5 are a partial perspective view and a partial cross-sectional view that show the mounting structure of a magnet plate and a hall sensor included in the EGR valve according to the present invention.
Figure 5:
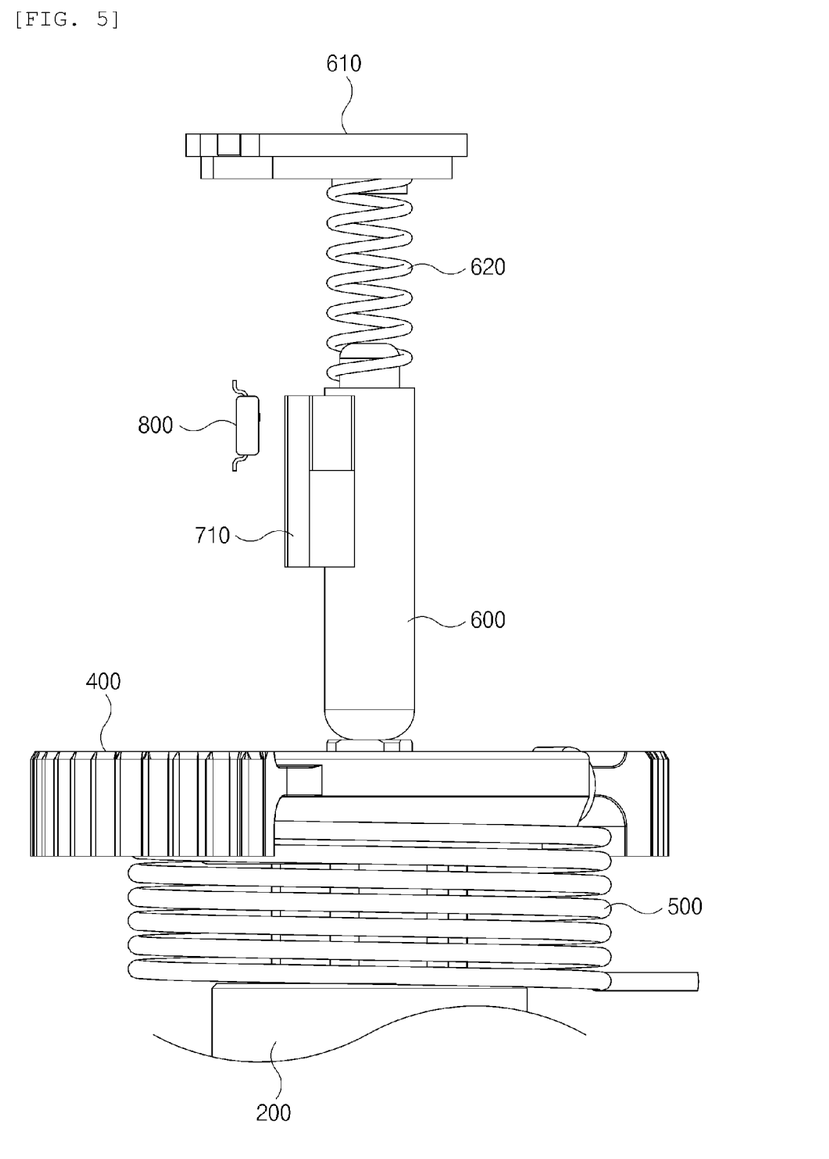

FIG. 3 is a perspective view showing the internal structure of an EGR valve according to the present invention and FIGS. 4 and 5 are a partial perspective view and a partial cross-sectional view that show the mounting structure of a magnet plate and a hall sensor included in the EGR valve according to the present invention.

An EGR valve according to the present invention has a prominent characteristic in that it can adjust the return amount of exhaust gas by moving up and down a valve shaft and can more accurately measure the up-down movement positions of the valve shaft.

That is, as shown in FIGS. 3 to 5, the EGR valve according to the present invention includes: as basic components, a valve shaft 100 vertically disposed and returning exhaust gas by moving up and down while rotating about its vertical central axis; a cylindrical cam 200 integrally fitted on an upper portion of the valve shaft 100; a rotary gear 400 partially fitted on the cylindrical cam 200 to be rotated by a rotary motor 430; an elevating block 600 coupled to the upper end of the valve shaft 100 passing through the cylindrical cam 200; a pressing spring 620 applying elasticity downward to the elevating block 600; a magnet plate 700 fixed to a side of the elevating block 600; a hall sensor 800 sensing up-down movement of the magnet plate 700, and a housing 900 keeping these components therein.

A spiral groove 210 is formed on the outer side of the cylindrical cam 200 and an end of a fixed bearing 300 is slidably inserted in the spiral groove 210. The fixed bearing 300 is fixed without moving in any direction, so when the cylindrical cam 200 is rotated such that the end of the fixed bearing 300 is moved down in the spiral groove 210, the cylindrical cam 200 and the valve shaft 100 coupled to the cam are moved up by rotating. In contrast, when the cylindrical cam 200 is rotated such that the end of the fixed bearing 300 is moved up in the spiral groove 210, the cylindrical cam 200 and the valve shaft 100 coupled to the cam are moved down by rotating.

Meanwhile, a polyhedron 220 formed at the upper portion of the cylindrical cam 200 is inserted upward through the rotational center of the rotary gear 400, so even though the cylindrical cam 200 is moved up and down, the rotary gear 400 only rotates at the position without moving up and down. The structure in which as the rotary gear 400 is rotated, the cylindrical cam 200 and the valve shaft 100 move up and down by rotating is the same as the structure of the EGR valve described above with reference to FIGS. 1 and 2, so it is not described in detail herein.

The EGR valves of the related art and the present invention are different in configuration in that a magnet for outputting an up-down movement signal of the valve shaft 10 is integrally combined with the valve shaft 10 and moves up and down by rotating in the EGR valve of the related art shown in FIGS. 1 and 2, but the magnet plate 700 for sensing the up-down position of the valve shaft 100 is not integrally combined with the valve shaft 100, but is coupled to a side of the elevating block 600 that is pushed up by the valve shaft 100 in the EGR valve of the present invention.

That is, the lower end of the elevating block 600 is simply seated on the top of the valve shaft 100, so when the valve shaft 100 moves up by rotating, the elevating block 600 is simply moved straight up without rotating. In contrast, when the valve shaft 100 moves down by rotating, the elevating block 600 is moved straight down by the elasticity of a pressing spring 620 compressed between the elevating block 600 and a fixing cap 610.

As described above, when the elevating block 600 is moved straight down without rotating, it does not laterally shake or vibrate, so the magnet plate 700 fixed to the elevating block 600 also only moves straight up and down without laterally shaking or vibrating. Accordingly, according to the EGR valve of the present invention, even if the valve shaft 100 rotates at a predetermined angle while moving up and down, the hall sensor 800 can accurately sense the position of the magnet plate 700.

Meanwhile, in order to allow the magnet plate 700 only to move straight up and down, the elevating block 600 should not incline or shake to any one side when moving up and down. Accordingly, the EGR valve of the present invention further includes magnet holder 710 that is fixed to a side, which faces the hall sensor 800, of the elevating block 600 to keep the magnet plate 700 vertically erected. Further, guide wings 712 having ends inserted in the housing 900 to be able to slide up and down may be formed at both sides in the width direction of the magnet holder 710.

As described above, when the guide wings 712 are further formed at the magnet holder 710, the elevating block 600 can move only straight up and down without laterally inclining or shaking unless the guide wings 712 are damaged, so the magnet plate 700 can move only up and down without laterally shaking, that is, the hall sensor 800 can more accurately sense the up-down movement of the valve shaft 100.

The hall sensor 800 is provided to sense the position of the magnet plate 700 by sensing the magnetism of the magnet plate 700. When the side, which faces the hall sensor 800, of the magnet plate 700 is flat, even though the magnet plate 700 is moved up or down, the hall sensor 800 may not accurately sense the movement in the range in which the hall sensor 800 corresponds to the side of the magnet plate 700. Accordingly, it is preferable that the side of the magnet plate 700, which faces the hall sensor 800, is curved such that the center portion rather than the upper and lower portions is closer to the hall sensor 800. When the center portion of the side of the magnet plate 700 is convexly curved, as described above, it is possible to accurately determine which portion of the side of the magnet plate 700 the hall sensor 800 corresponds to, depending on the magnitude of the magnetism applied to the hall sensor 800, so it is possible to more precisely sense the height of the valve shaft 100.

The technical spirit of precisely sensing the height of the valve shaft 100 in accordance with the magnitude of the magnetism applied to the hall sensor 800 should be based on the assumption that the magnet plate 700 does not laterally shake or vibrate when moving up and down, so it cannot be applied to the EGR sensor shown in FIGS. 1 and 2.

Figure 6:
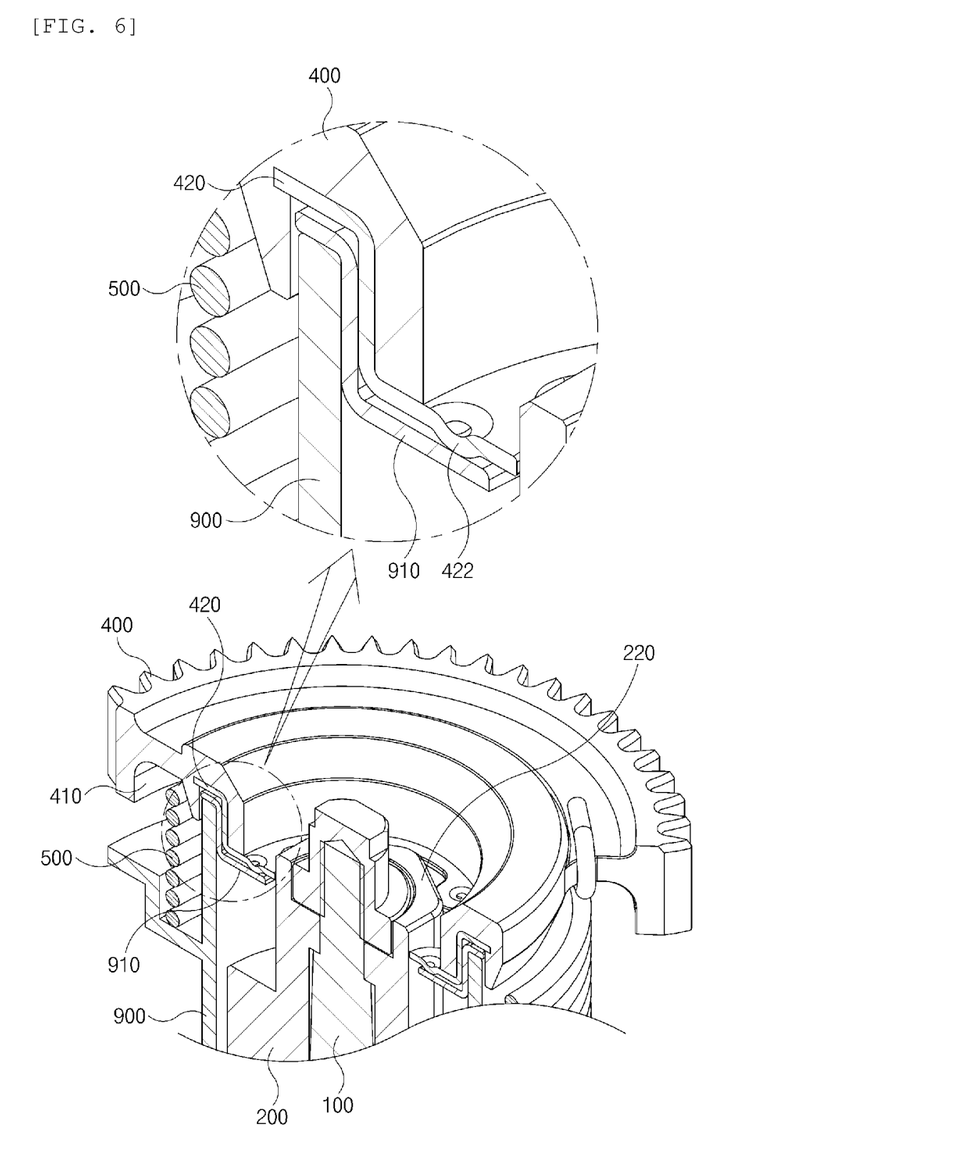
FIG. 6 is a perspective cross-sectional view showing a structure for seating a rotary gear included in the EGR valve according to the present invention on a housing.
Figure 7:
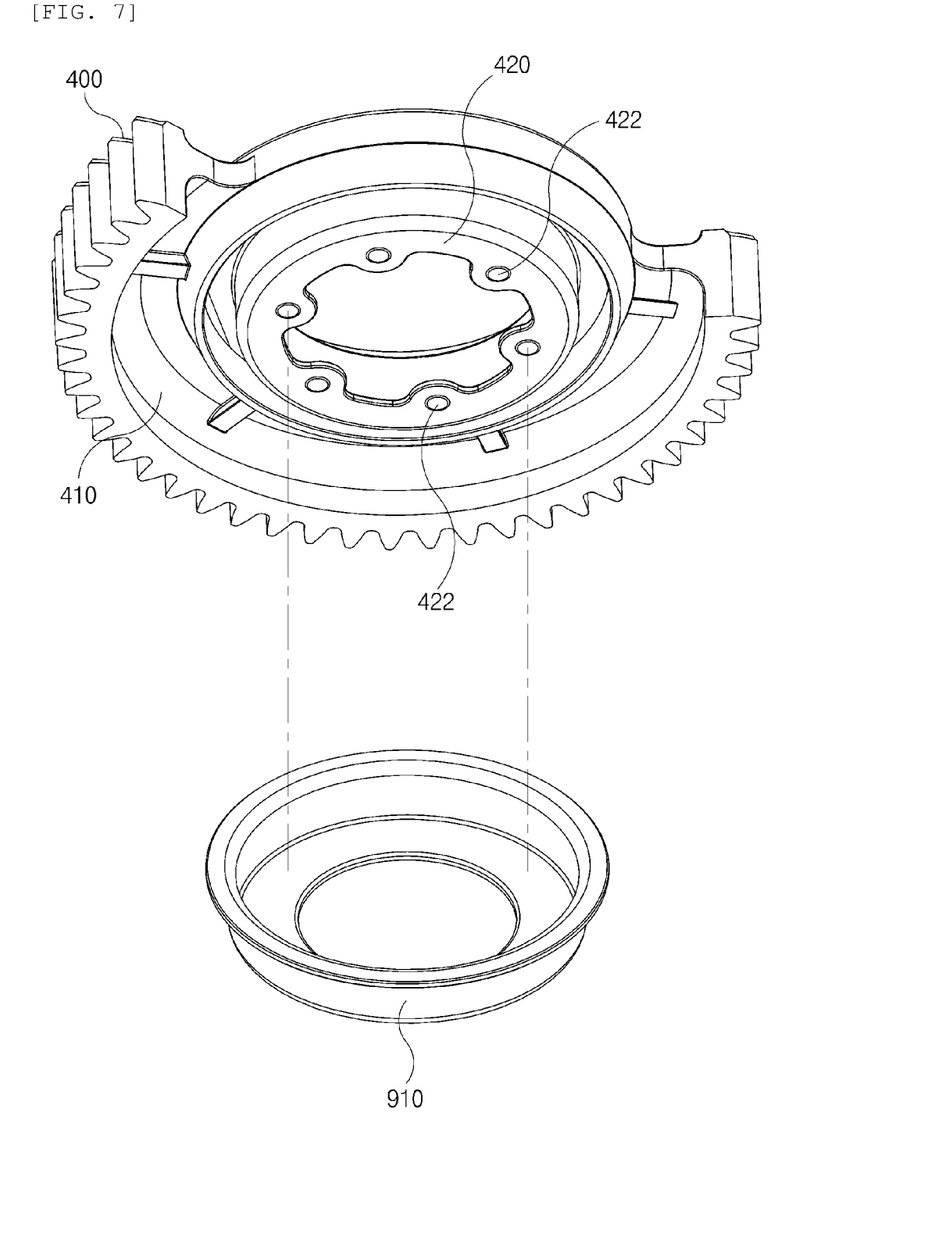
FIG. 7 is an exploded perspective view showing a stacking structure of a gear washer and a seating washer included in the EGR valve according to the present invention.

FIG. 6 is a perspective cross-sectional view showing a structure for seating the rotary gear 400 included in the EGR valve according to the present invention on the housing 900 and FIG. 7 is an exploded perspective view showing a stacking structure of a gear washer 420 and a seating washer 910 included in the EGR valve according to the present invention.

According to the EGR valve of the present invention, a return spring that applies rotational elasticity to the rotary gear 400 is provided to return the rotary gear 400 when the rotary gear 400 is rotated in a predetermined direction by the rotary motor 430 and then the torque from the rotary motor 430 is removed.

The return spring 500 is a coil spring wound around a portion of the cylindrical cam 200 with the top coupled to the bottom of the rotary gear 400, so when the rotary gear 400 is rotated, the top is rotated with the rotary gear 400, thereby forming returning elasticity. When the return spring 500 is turned, as described above, the inner diameter of the return spring 500 decreases, the return spring 500 is interfered with the housing 900, so the rotary gear 400 cannot be normally rotated, which causes various problems such as noise and vibration and damage to the return spring 500 and the housing 900.

According to the EGR valve of the present invention, a ring-shaped seating groove 410 in which the top of the return spring 500 is inserted may be formed on the bottom of the rotary gear 400 to prevent the interference on the return spring 500 by the housing 900. As the seating groove 410 is formed on the bottom of the rotary gear 400, the return spring 500 is not interfered with the housing 900 unless the top of the return spring 500 is separated out of the seating groove 410, so it is possible to prevent abnormal rotation of the rotary gear 400, and noise, vibration, and damage to parts described above.

Meanwhile, the rotary gear 400 is fitted on an upwardly protruding cylindrical end of the housing 900 and rotated by the rotary motor. In general, the rotary gear 400 is made of synthetic resin and the housing 900 is made of aluminum alloy, so when the rotary gear 400 is rotated in contact with the housing 900, the rotary gear 400 or the housing 900 is quickly worn.

Accordingly, the EGR valve of the present invention may include a gear washer 420 and a seating washer 910 that are made of stainless steel and disposed at the contact portions of the rotary gear 400 and the housing 900. The gear washer 420 is formed in a ring shape and disposed on the portion, which is seated on the housing 900, of the bottom of the rotary gear 400, and the seating washer 910 is formed in a ring shape and disposed on the portion, which corresponds to the gear washer 420, of the housing 900. That is, the gear washer 420 for the rotary gear 400 is, a shown in FIG. 6, disposed on the seating washer 910 for the housing 900, so when the rotary gear 400 is rotated, friction is generated only between the gear washer 420 and the seating washer 910 except for the other portions.

Since the gear washer 420 and the seating washer 910 are made of stainless steel having large frictional strength, it is possible to obtain the advantage that the rotary gear 400 is not easily worn even if rotated for long period of time, that is, durability of the rotary gear 400 and the housing 900 is remarkably increased.

Further, a downward projection 422 that protrudes downward may be formed at the portion, which is seated on the seating washer 910, on the bottom of the gear washer 420 so that the gear washer 420 can be more smoothly rotated on the seating washer 910 by reducing the contact area between the gear washer 420 and the seating washer 910. The downward projection 422 is formed convexly in a semi-spherical shape to be in point contact with the seating washer 910. Accordingly, it is possible to obtain the effect that the contact area between the gear washer 420 and the seating washer 910 is minimized, that is, the gear washer 420 can be more smoothly rotated on the seating washer 910. Meanwhile, when the downward projection 422 is formed on the bottom of the gear washer 420 close to the rotational axis of the gear washer 420, the distance from the rotational axis of the gear washer 420 to the contact point of the downward projection 422 is reduced, so frictional torque can be decreased.

If the downward projection 422 is formed only at a side on the bottom of the gear washer 420, not only the portion without the downward projection 422 of the bottom of the gear washer 420 is in linear or surface contact with the top of the seating washer 910, but also a serious problem that the rotary gear 400 is inclined may be caused. Accordingly, it is preferable that three or more downward projections 422 are arranged radially from the rotational axis of the rotary gear 400.

When three or more downward projections 422 are arranged, as described above, it is possible to prevent the rotary gear 400 from inclining or the gear washer 420 from coming in linear or surface contact with the seating washer 910, so to rotary gear 400 can more smoothly and stably rotate.

Although the present invention was described above in detail by means of embodiments, the present invention is not limited to the specific embodiments and should be construed on the basis of claims. Further, it should be understood that the present invention may be changed and modified in various ways by those skilled in the art without departing from the scope of the present invention.

The invention claimed is:
1. A EGR valve comprising:
 a valve shaft vertically disposed and rotating about a vertical rotational axis;

a cylindrical cam integrally fitted around an upper portion of the valve shaft and having a spiral groove on an outer side and a polyhedron at an upper end;

a fixed bearing fixed to a side of the cylindrical camp with an end slidably inserted in the spiral groove;

a rotary gear having the polyhedron inserted on the rotational axis therein and rotated by a rotary motor;

an elevating block disposed at an upper end of the valve shaft passing through the cylindrical cam and pushed upward by the valve shaft when the valve shaft is moved up;

a pressing spring applying downward elasticity to the elevating block;

a magnet plate fixed to a side of the elevating block;

a hall sensor sensing up-down movement of the magnet plate; and a housing keeping the valve shaft, the cylindrical camp, the rotary gear, and the elevating block therein.

2. The EGR valve of claim 1, further comprising a magnet holder fixed to a side, which faces the hall sensor, of the elevating block and keeping the magnet plate vertically erected on the side facing the hall sensor, wherein guide wings having ends inserted in the housing to be able to slide up and down are formed at both sides in a width direction of the magnet holder.

3. The EGR valve of claim 1, wherein a side, which faces the hall sensor, of the magnet plate is curved to be closer to the hall sensor at a center portion than upper and lower portions.

4. The EGR valve of claim 1, further comprising a return spring formed in a coil spring shape fitted around a portion of the cylindrical cam with a top coupled to a bottom of the rotary gear to apply rotational elasticity to the rotary gear, wherein a ring-shaped seating groove in which the top of the return spring is fitted is formed on a bottom of the rotary gear.

5. The EGR valve of claim 1, wherein the rotary gear is seated on a upwardly protruding cylindrical end of the housing and has a ring-shaped gear washer made of stainless steel and disposed at a portion seated on the housing, and the housing has a seating washer made of stainless steel and disposed under the gear washer.

6. The EGR valve of claim 5, wherein a downward projection protruding downward to be in point contact with the seating washer is formed at a position, which is seated on the seating washer, on a bottom of the gear washer.

7. The EGR valve of claim 6, wherein three or more downward projections are formed and arranged radially from a rotational axis of the rotary gear.

* * * * *